United States Patent [19]

Gillett

[11] Patent Number: 4,544,223

[45] Date of Patent: Oct. 1, 1985

[54] ACTUATOR FOR ZERO INSERTION FORCE CONNECTORS

[75] Inventor: John B. Gillett, Kingston, N.Y.

[73] Assignee: International Business Machines Corporation, Armonk, N.Y.

[21] Appl. No.: 545,702

[22] Filed: Oct. 26, 1983

[51] Int. Cl.[4] .......................................... H01R 13/631
[52] U.S. Cl. ......................... 339/75 MP; 339/176 MP
[58] Field of Search ........ 339/17 L, 75 MP, 176 MP, 339/74 R

[56] References Cited

U.S. PATENT DOCUMENTS

| Re. 29,223 | 5/1977 | Pritulsky | 339/75 MP |
|---|---|---|---|
| 3,550,062 | 12/1970 | Drenten et al. | 339/75 MP |
| 3,587,031 | 6/1971 | Flavin et al. | 339/75 MP |
| 3,899,234 | 8/1975 | Yeager et al. | 339/75 MP |
| 3,920,302 | 11/1975 | Cutchaw | 339/75 MP |
| 3,944,311 | 3/1976 | Sprenkle et al. | 339/45 M |
| 4,159,861 | 7/1979 | Anhalt | 339/75 MP |
| 4,169,644 | 10/1979 | Bonhomme | 339/75 MP |

FOREIGN PATENT DOCUMENTS

| 68195 | 1/1983 | European Pat. Off. | 339/75 MP |
|---|---|---|---|
| 1125990 | 3/1962 | Fed. Rep. of Germany | 339/75 MP |

OTHER PUBLICATIONS

IBM Technical Disclosure Bulletin, vol. 14, No. 9, Feb. 1972, "Twin Contact Connector", Colletti et al.

*Primary Examiner*—John McQuade
*Attorney, Agent, or Firm*—M. Schecter; J. Henderson, Jr.; J. Jancin, Jr.

[57] ABSTRACT

An actuator for a zero insertion force printed circuit board connector. Two connectors are used in opposing pairs to connect to parallel edges of a printed circuit board. Moving a first actuator mechanism on the first connector moves the printed circuit board toward the opposite connector to a fixed position and then causes a closing/wiping action of the contacts of the first connector. A second actuator mechanism, located on the second connector, has operation substantially identical to that of the first mechanism except the printed circuit board does not move. The two connectors are mechanically substantially identical and the actuation sequence is independent of the handle sequence. Another embodiment for contacting a single edge of a printed circuit board is disclosed wherein one of the aforementioned two connectors is replaced by a simple guideway.

24 Claims, 18 Drawing Figures

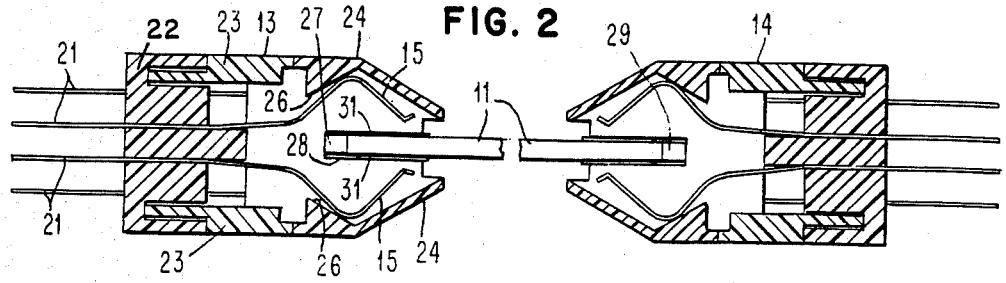
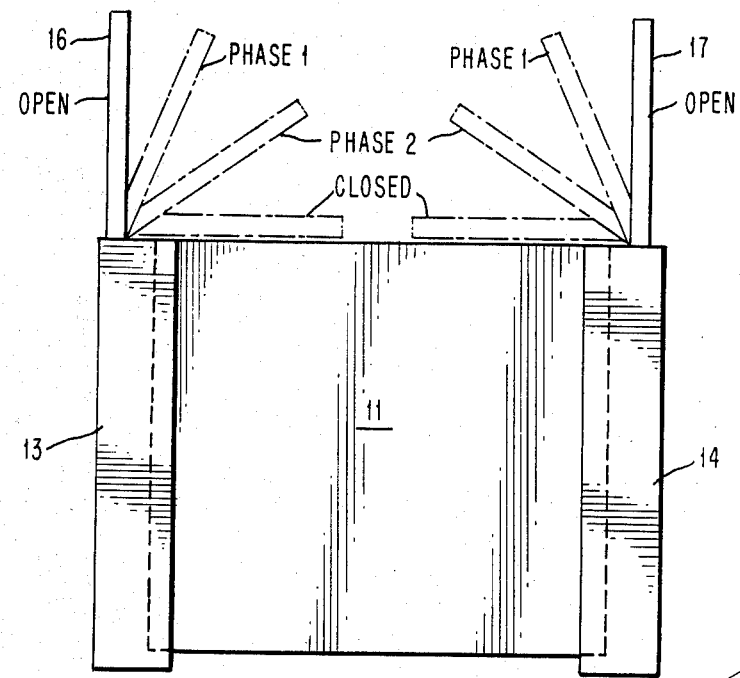
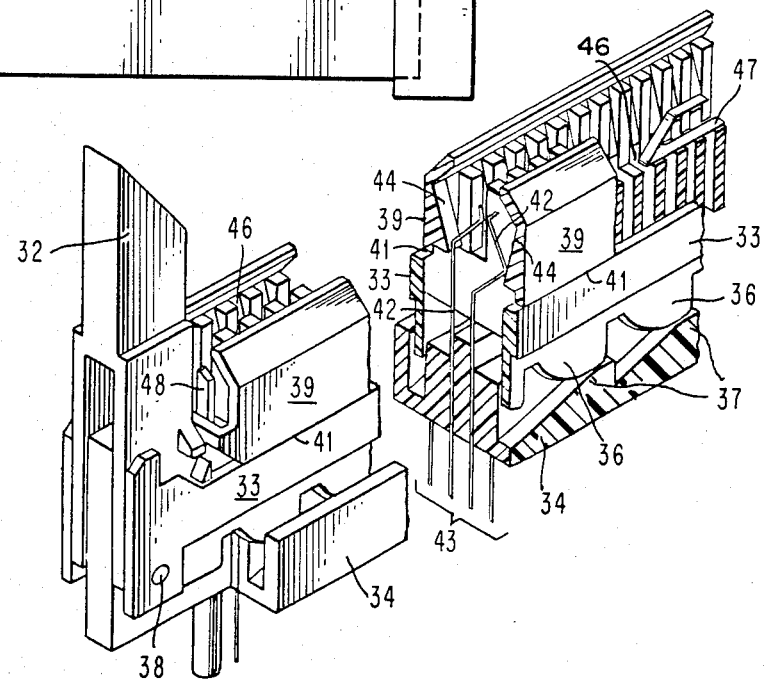

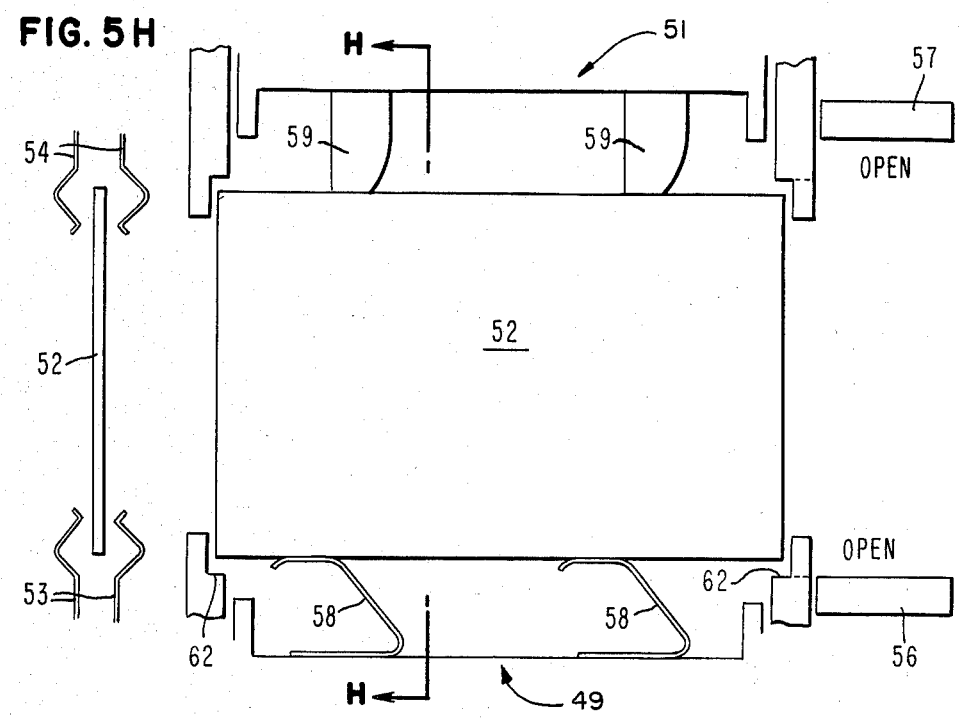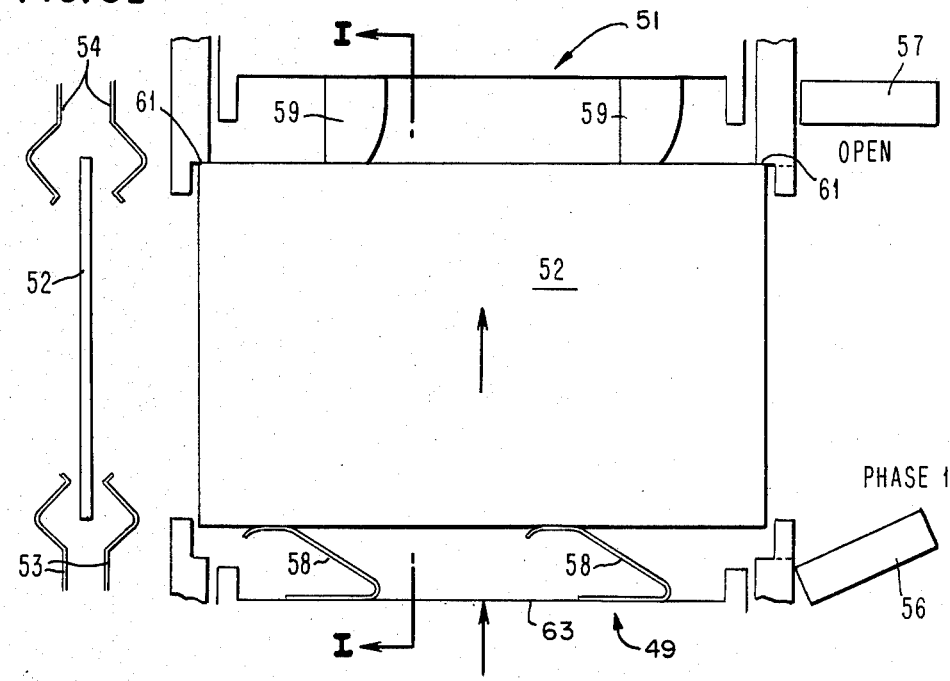

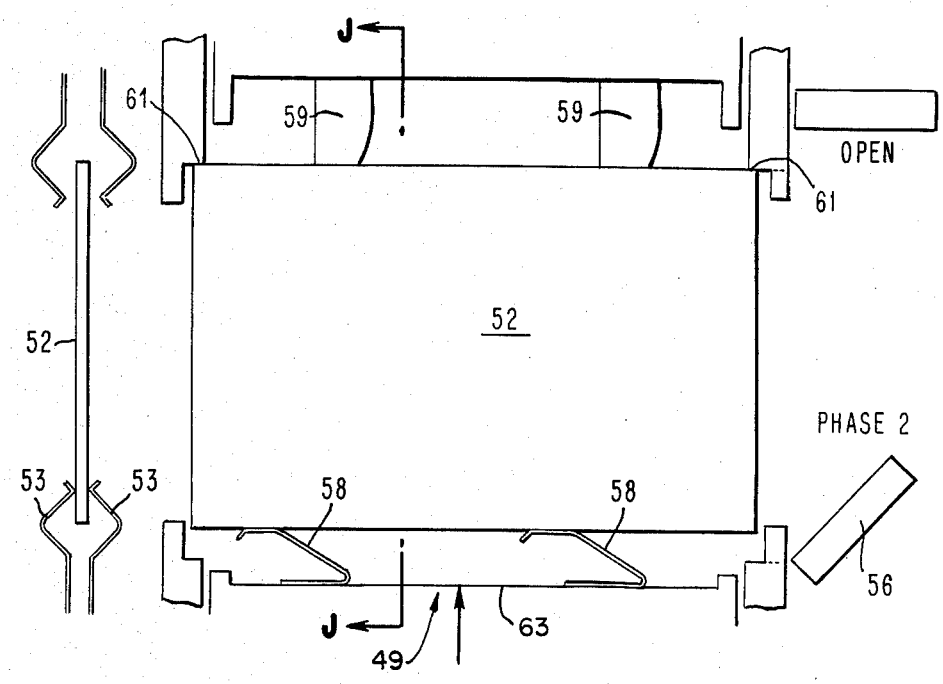
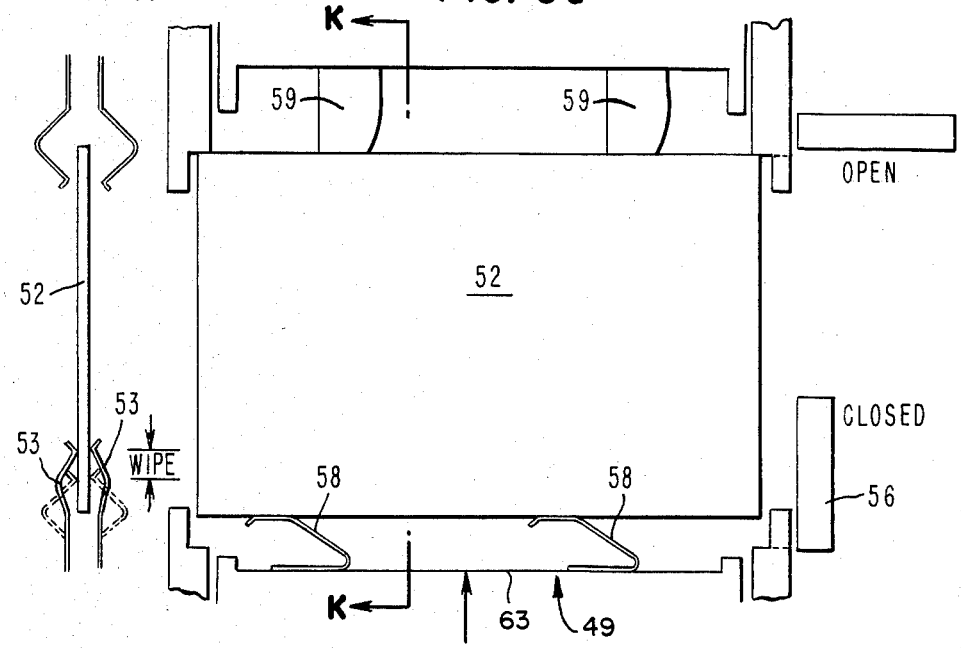

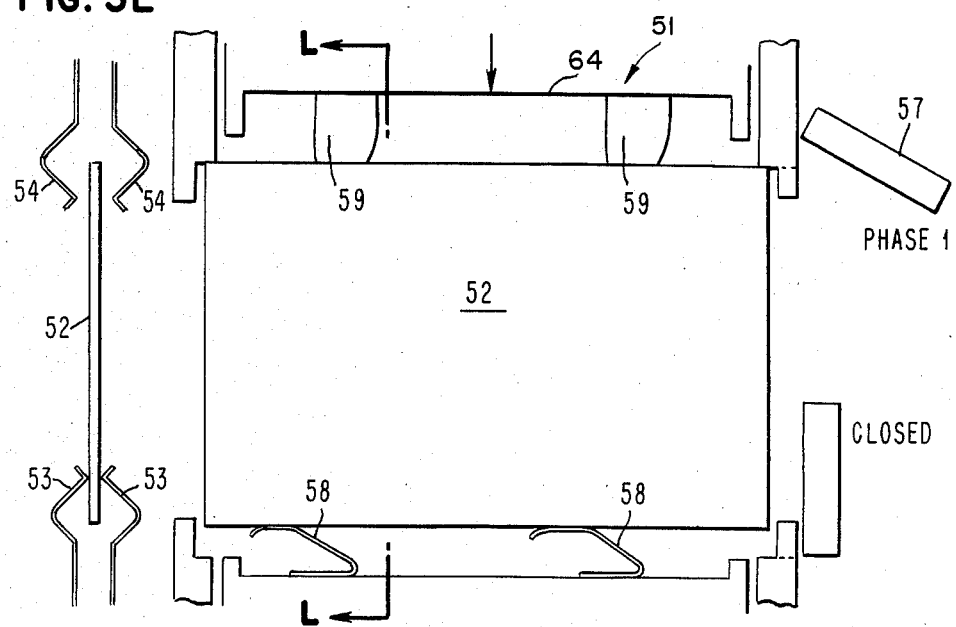
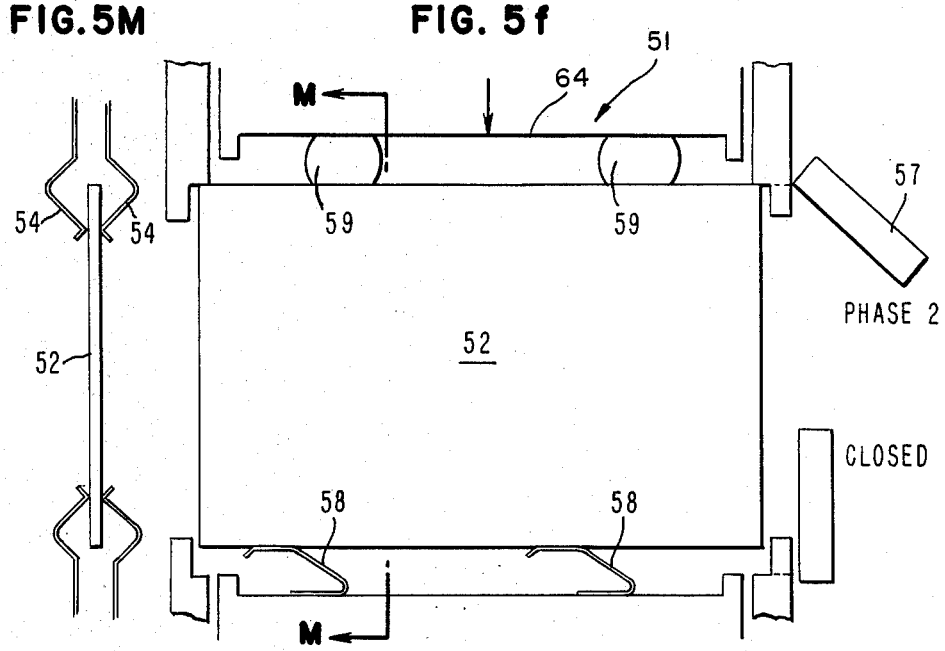

ACTUATOR FOR ZERO INSERTION FORCE CONNECTORS

DESCRIPTION

1. Technical Field

The invention relates to actuators for zero insertion force type edge connectors used to establish electrical contact with electronic components such as printed circuit boards.

2. Background of the Invention

Various zero insertion force (ZIF) connectors exist for receiving a printed circuit board edge with electrical contact areas disposed thereon. These connectors typically have actuating mechanisms, including camming means and the like, for moving rows of contact pins into and out of a board insertion path.

In the characteristic action of these known ZIF connectors, the contact pins are moved out of the board insertion path for inserting and extracting the printed circuit board into and out of the ZIF connector. The pins are moved into the board insertion path when a board is present within the connector in order to effect engagement between the contact pins of the ZIF connector and the contact areas disposed on the surface of the printed circuit board.

The action of the individual contact pins engaging the electrical contact areas of the printed circuit board usually includes a wipe action whereby surface oxide film, dust particles, or other foreign substances are removed from the contact areas and contact pins to insure a positive electrical connection.

These ZIF connectors with wipe action have enjoyed wide spread application in the digital processing area where circuit density and miniaturization are constantly increasing. Increased circuit density allows more components to be placed on a single printed circuit board which consequently increases the number and density of contact areas disposed along the edges of the board.

As the number of edge contact areas increases, the wiping force also increases. The wiping force eventually reaches a point where, during attempted wipe action, the contact pins move the printed circuit board rather than wipe the surface of the board. This effect is highly undesirable because the benefits of the wipe action are lost and electrical contact integrity is degraded.

Solutions to this problem have, heretofore, required special printed circuit board shapes, including holes and notches, which mate with latching mechanisms incorporated in the zero insertion force connector. These configurations unnecessarily increase the complexity and cost of the connector and board. Also, these latching mechanisms do not lend themselves to the use in opposing connector pairs due to critical mechanical alignment requirements.

SUMMARY OF THE INVENTION

The invention as herein disclosed and claimed solves the aforementioned problems by providing an inexpensive ZIF connector that moves a mating electronic component to a fixed position before commencing the contact wipe action. During contact wipe, the electronic component cannot move and the contact areas and contact pins realize the benefit of a full wipe action.

A preferred embodiment is an opposing pair of ZIF connectors used to connect to two substantially parallel edges of the same electronic component.

Movement of the first actuator mechanism of the first connector moves the electronic component toward the opposite connector to fixed position. Continued movement of the first actuator mechanism causes contact pins in the first connector to engage and wipe contact area disposed along the edge of the electronic component adjacent the first connector.

Movement of a second actuator mechanism of the second connector does not move the electronic component but does cause contact pins in the second connector to engage and wipe contact areas disposed along the edge of the electronic component adjacent the second connector.

The first and second connectors are mechanically substantially identical so that either actuator mechanism can be moved first without affecting the integrity of the wipe action. This identity also lowers manufacturing costs by increasing product volume.

In another embodiment, electrical contact to a single edge of an electronic component can be effected by replacing one of the aforementioned opposing pair of connectors with a simple guideway. In this embodiment, the guideway acts a a mechanical stop for the electronic component during the actuation of the opposing connector.

Accordingly, it is an object of the invention to provide a simple ZIF connector that ensures wiping action between the contact pins of the connector and contact areas of a mating electronic component.

Another object of the invention is to provide a low-cost ZIF connector that can be used in opposing pairs to connect to two substantially parallel edges of the same electronic component.

Yet another object of the invention is to provide opposing ZIF connectors that allow an unskilled operator to actuate opposing connectors, in any sequence, without affecting the contact wipe action and integrity of the resulting electrical connection.

BRIEF DESCRIPTION OF THE DRAWINGS

FIG. 2 is a view through section 2—2 of FIG. 1.

FIG. 3 is a side view of the connector pair of FIG. 1 showing the actuator handle sequence.

FIG. 4 is a sectional view of an individual connector of FIG. 1.

FIGS. 5a–g are simplified mechanical schematics illustrating the positions of critical elements during the actuation sequence of the connector pair of FIG. 1.

FIGS. 5H–N are sectional views taken from section H—H through section N—N of FIGS. 5a–g, respectively.

DETALIED DESCRIPTION OF THE PREFERRED EMBODIMENT

Figure 1:
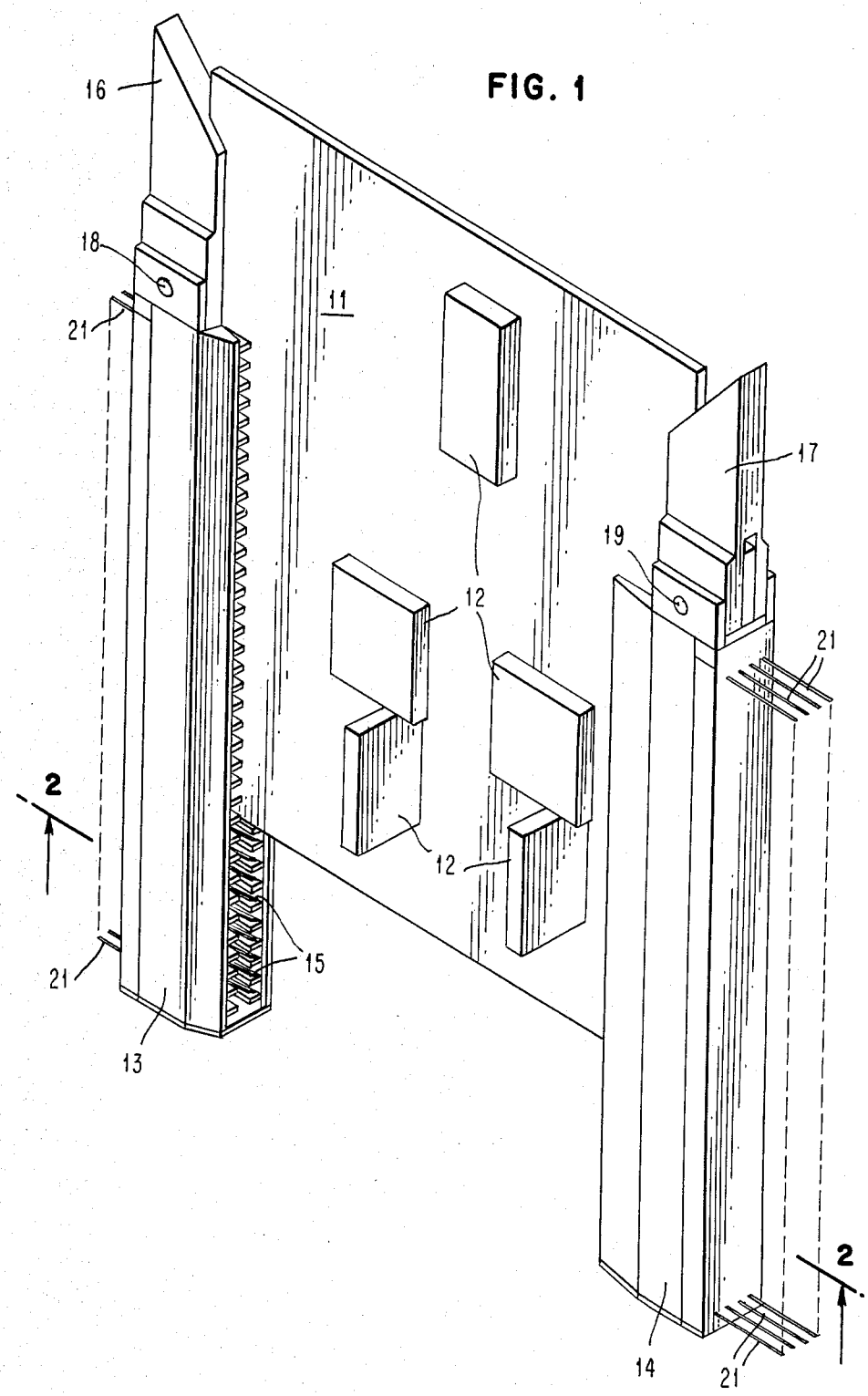
FIG. 1 is an opposing pair of ZIF connectors according to this invention.

Referring to the drawings, FIG. 1 is a preferred embodiment for an electrical connector for contacting two substantially parallel edges of electronic component 11. Electronic component 11 can be, for example, a printed circuit board, a ceramic substrate, a porcelanized steel substrate, or any other surface used to support electrical circuitry.

Electronic component 11 has, disposed thereon, electronic elements 12. Elements 12 are, for example, resistive or capacitive elements or integrated circuits or any combination thereof. Elements 12 are connected to electrical contact areas (not shown) located along two substantially parallel edges of electronic component 11. Electrical connection between elements 12 and the contact areas is provided by conductive circuit paths (not shown) placed on or under the surface of electronic component 11.

Electronic component 11 is shown partially inserted into opposing electrical connectors 13 and 14. Connectors 13 and 14 both have, therein, rows of contact pins 15 for contacting the electrical contact areas along the edges of electronic component 11. Contact pins 15 are moved into and out of a substantially planar insertion path (shown occupied by electronic component 11). Movement of actuator handles 16 and 17 of connectors 13 and 14 respectively causes pins 15 to move into and out of the insertion path. A detailed description of the actuation mechanism is presented below.

Handles 16 and 17 are both shown in the open position wherein pins 15 are retracted from the insertion path. This allows electronic component 11 to enter connectors 13 and 14 with low insertion force.

When electronic component 11 is fully inserted into connectors 13 and 14, handles 16 and 17 are pivoted about hinge pins 18 and 19, respectively, thereby moving contact pins 15 toward the insertion path and into engaging contact with the contact areas located along the adjacent edges of electronic component 11.

Each conductor pin 21 is electrically common with a respective contact pin 15. Connectors 13 and 14 are typically mounted on mother boards (not shown) with conductor pins 21 extending through vias in the mother boards.

For connectors 13 and 14 shown in FIG. 1, two mother boards would be used with each motherboard being substantially parallel with each other, and substantially perpendicular with electronic component 11. Conductor pins 21 would connect to electrical circuitry placed on the surface of the mother boards which would, in turn, be connected to other electronic components through other connectors mounted on the motherboards. By this arrangement, electronic elements 12 located on electronic component 11 would be electrically connected to an entire electrical system through contact pins 15 and conductor pins 21.

FIG. 2 is a view taken through section 2 of FIG. 1. Connectors 13 and 14 are mechanically substantially identical and a description of only connector 13 will be given with the understanding that the description can be applied to connector 14 as well.

Contact pins 15 extend through base portion 22 and terminate at conductor pins 21. Contact pins 15 are formed so as to be self-biased away from the component insertion path shown occupied by electronic component 11.

Linear cam 23 is shown in the unactuated position adjacent base portion 22. Housing 24 cooperates with linear cam 23 so as to move away from base portion 22 as linear cam 23 moves longitudinally of and away from base portion 22. Details of this cooperation are described below.

Inclined surfaces 26 are attached to housing 24 and slideably engage contact pins 15 so that as housing 24 is moved away from base portion 22 by linear cam 23, inclined surfaces 26 urge contact pins 15 toward the component insertion path. As inclined surfaces 26 continue to move pins 15 toward the insertion path, pins 15 engage and wipe contact areas 31 located on the surface of electronic component 11.

Resilient member 27 occupies the bottom portion of slot 28 in housing 24. As housing 24 moves away from base portion 22, resilient member 27 compresses and also moves electronic component 11 away from connector 13 and toward connector 14. As electronic component 11 moves, resilient member 29, located in connector 14, may also compress.

Referring to FIG. 3, electronic component 11 is shown completely inserted into opposing connectors 13 and 14. For insertion and extraction of electronic component 11 into and from connectors 13 and 14, actuator handles 16 and 17 are in the OPEN Position. After electronic component 11 is inserted, either handle 16 or 17 is moved, by an operator, from the OPEN Position through the PHASE 1, PHASE 2, and to the CLOSED Position as shown by the dashed lines. The handle remaining in the OPEN position is then moved from OPEN through PHASE 1, PHASE 2 and to the CLOSED position, thereby completing the actuation sequence. Connectors 13 and 14 are mechanically substantially identical and either handle 16 or 17 can be moved first without affecting the integrity of the resultant electrical connection. This allows an unskilled operator to actuate the connector.

FIG. 4 is a partial section view of a connector used in this invention. Actuator handle 32 is shown in the fully actuated or CLOSED position. Linear cam 33 is shown in the left-most position within base portion 34. Cam lobes 36 ride cam followers 37 and force linear cam 33 away from base portion 34. As handle 32 is moved in a counter-clockwise direction about hinge pin 38, linear cam 33 moves to the right within base portion 34. During this left-to-right motion of linear cam 33, cam lobes 36 ride cam followers 37 thereby allowing linear cam 33 to move closer to base portion 34. Housing 39 is slideably engaged with linear cam 33 along surface 41. As linear cam 33 moves toward or away from base portion 34 due to the coaction of cam lobes 36 and cam followers 37, housing 39 also moves toward or away from base portion 34. Sliding surface 41 does not transfer the linear right-to-left motion from linear cam 33 to housing 39.

Contact pins 42 extend through base portion 34 and terminate at conductor pins 43. Only one pair of contact pins 42 is shown in FIG. 4 in order to improve clarity.

Inclined surfaces 44, attached to housing 39, are slideably engaged with contact pins 42. As housing 39 moves away from base portion 34 during the actuation sequence, inclined surfaces 44 urge contact pins 42 toward the center of slot 46 which occupies a portion of the aforementioned component insertion path. Contact pins 42 are self-biased away from the insertion path and as housing 39 moves toward base portion 34, pins 42 move away from the insertion path.

Here it should be noted that the illustration of this particular actuator mechanism will not be construed to delimit the invention in any manner. One skilled in the art will appreciate that other actuator mechanisms can be substituted without departing from the scope and intent of the present invention. Examples of other actuator mechanisms include rotating cams operated by a handle or tool as well as tool operated linear cams.

Resilient member 47 is located at the bottom portion of slot 46 in housing 39. Resilient member 47 can be, for example, an elastomer pad or a formed metallic spring. A plurality of resilient members 47 are typically placed at the bottom portion of slot 46 to provide a uniform force exerted along the edge of an electronic component (not shown) inserted into slot 46.

A fixed stop 48 is located at each end of slot 46. Fixed stop 48 abuts the edge of an electronic component inserted in slot 46 after resilient members 47 have been partially compressed.

Figure 5G:
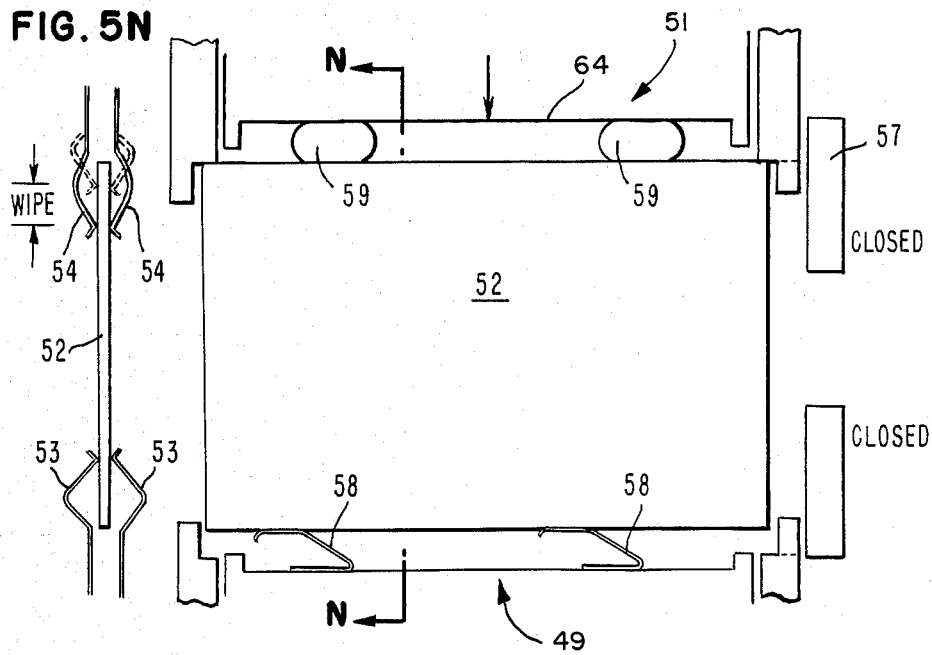

A description of the actuation sequence of a connector according to this invention is best understood with reference to FIG. 5. FIGS. 5a-g are simplified mechanical schematics showing the positions of critical elements of the connectors during the actuation sequence. FIGS. 5H-N are sectional views taken from sections H—H through N—N of FIGS. 5a-g respectively showing the relative positions of electronic component 52 and contact pins 53 and 54.

Referring to FIG. 5a, electronic component 52 is fully inserted, from right to left, in opposing connectors 49 and 51. Connectors 49 and 51 are similar to connectors 13 and 14 in FIG. 1 and are constructed according to the drawing and description of the connector of FIG. 4. Actuator handles 56 and 57 are both in the OPEN position and connectors 49 and 51 are in the unactuated state. Resilient members 58 and 59 are in the uncompressed state and contact pins 53 and 54 (FIG. 5H) are shown retracted from the component insertion path (shown occupied by component 52). Resilient members 58 are illustrated as formed springs whereas resilient members 59 are illustrated as elastomer pads.

Referring to FIG. 5b, handle 56 of connector 49 is moved from the OPEN position to the PHASE 1 position. The bottom portion 63 of connector 49 is moved, by camming action previously described, in the arrow-marked direction thereby compressing resilient members 58 and forcing electronic component 52 to move in the arrow-marked direction toward connector 51. Electronic component 52, in turn, compresses resilient members 59 until component 52 abutts fixed stops 61 in connector 51. Referring to FIG. 5I, contact pins 53 and 54 do not move during this portion of the actuation sequence.

Referring to FIG. 5c, handle 56 has moved to the PHASE 2 position causing the bottom portion 63 of connector 49 to move further in the arrow-marked direction thereby further compressing resilient members 58. Electronic component 52 does not move because it abutts fixed stops 61. As a result, resilient members 59 do not compress further.

Referring to FIG. 5J, contact pins 53 of connector 49 move toward the component insertion path and engage contact areas (not shown) disposed on the surface of electronic component 52 along the edge of component 52 adjacent connector 49.

Referring to FIG. 5d, handle 56 has moved to the CLOSED position causing the bottom portion 63 of connector 49 to move further in the arrow-marked direction. Resilient members 58 compress further but component 52 does not move and resilient members 59 do not compress further. Contact pins 53 wipe the contact areas on the surface of electronic component 52 as shown in FIG. 5K. At the completion of the wipe, pins 53 grip the surface of component 52 with a gripping force that is substantially normal to the surface of component 52.

Continuing with the actuation sequence in FIG. 5e, handle 57 of connector 51 is moved from the OPEN position to the PHASE 1 position. This causes the bottom portion 64 of connector 51 to move in the arrow-marked direction thereby compressing resilient members 59. Electronic component 52 does not move and resilient members 58 do not compress further. This is because the static friction force on the surface of component 52 due to the gripping force of contact pins 53 exerted on the surface of electronic component 52, combined with the force exerted on the edge of electronic component 52 by resilient members 58 are sufficient to maintain component 52 stationary. Contact pins 54 do not move during this portion of the actuation sequence as can be seen in FIG. 5L.

Referring to FIG. 5f, handle 57 is moved to the PHASE 2 position causing the bottom portion 64 of connector 51 to move further in the arrow-marked direction. Resilient members 59 compress further but electronic component 52 does not move for the same reasons as mentioned above in the description of FIG. 5e.

Referring to FIG. 5M, contact pins 54 engage contact areas (not shown) disposed on the surface of electronic component 52 along the edge of component 52 adjacent connector 51.

In FIG. 5g, handle 57 is moved to the CLOSED position causing bottom portion 64 of connector 51 to move further in the arrow-marked direction. Resilient members 59 compress further and contact pins 54 (shown in FIG. 5N) wipe the surface of electronic component 52. Component 52 does not move during this wipe action because the static friction force on the surface of electronic component 52 due to the gripping force of pins 53, combined with the spring force of resilient members 58, are greater than the wiping force of pins 54. At the completion of the wipe, pins 54 grip the surface of component 52 with a gripping force that is substantially normal to the surface of component 52 and this completes the actuation sequence.

If, in FIG. 5a, handle 57 were moved first, component 52 would move away from connector 51 and toward connector 49 until component 52 abutted fixed stops 62 in connector 49. The actuation sequence would then proceed substantially as described above with the engaged/wipe action of pins 54 in connector 51 occurring before the engaged/wipe action of pins 53 in connector 49. The actuation sequence is, therefore, independent of the actuator handle timing sequence and either handle 56 or 57 can be moved first without affecting the integrity of the resultant electrical connection between pins 53 and 54 and contact areas on the surface of component 52.

If component 52 has contact areas disposed along only one edge, for example, the edge adjacent connector 49, connector 51 could be replaced by simple guideway having fixed stops 61. The actuation sequence would then be completed at FIG. 5d because the substituted simple guideway has no contact pins therein and no actuator mechanism.

It should also be noted that opposing pairs of contact pins (e.g., opposing pair 53 and opposing pair 54) are necessary if component 52 has contact areas disposed on two surfaces thereof. If component 52 has contact areas disposed on only one surface, contact pins would be required only for that surface. This would result in the connectors illustrated in the drawings having only a single row of contact pins instead of the double row shown.

While the invention has been particularly shown and described with reference to a preferred embodiment thereof, it will be understood by those skilled in the art that the foregoing and other changes in form and detail may be made therein without departing from the scope of the invention.

I claim:

1. A zero insertion force type edge connector for electrically engaging at least one edge of an electronic component comprising:
   a first and a second base portion supporting a first and a second housing respectively, at least one housing having at least one row of electrical contacts therein;
   an elongated slot in each of said housings for receiving an edge of said electronic component;
   actuator means;
   first means responsive to said actuator means for moving said electronic component to a fixed position; and
   second means responsive to said actuator means for moving said at least one row of electrical contacts toward said electronic component after said electronic component is moved to said fixed position, whereby said contacts engage and wipe electrical contact areas on said electronic component.

2. A zero insertion force type edge connector as recited in claim 1 wherein said second means includes inclined surfaces, attached to said at least one housing having at least one row of contacts, for slideably engaging said at least one row of contacts.

3. A zero insertion force type edge connector as recited in claim 2 wherein at least one said housing is moveable in a direction substantially perpendicular with the longitudinal dimension of said elongated slot in said housing.

4. A zero insertion force type edge connector as recited in claim 3 wherein said electronic component includes a printed circuit board.

5. A zero insertion force type edge connector as recited in claim 3 wherein said electronic component includes a ceramic substrate.

6. A zero insertion force type edge connector as recited in claim 3 wherein said electronic component includes a procelainized steel substrate.

7. A zero insertion force type connector for electrically engaging two substantially parallel edges of a printed circuit board comprising:
   a first and a second base portion supporting a first and a second housing respectively, each housing having two rows of contacts therein;
   an elongated slot in each of said housings between said two rows of contacts for receiving said board along a path that is substantially parallel to said slot;
   said first and second housings being arranged so that a plane passes through both of said slots whereby said printed circuit board, lying in said plane, enters said slot in each of said housings;
   actuator means;
   first means responsive to said actuator means for moving said printed circuit board to a fixed position; and
   second means responsive to said actuator means for moving said rows of contacts toward said plane after said board is moved to said fixed position, whereby said contacts engage and wipe electrical contact areas on said board.

8. A zero insertion force type edge connector for electrically engaging one edge of a printed circuit board comprising:
   a first and a second base portion supporting a first and a second housing respectively, said first housing having at least one row of electrical contacts therein;
   an elongated slot in each of said housings for receiving said printed circuit board along a path substantially parallel to said slot;
   said first and second housings being arranged so that a plane passes through both of said slots whereby said printed circuit board, lying in said plane, enters said slot in each of said housings;
   actuator means;
   first means responsive to said actuator means for moving said printed circuit board away from said first base portion and toward said second base portion to a fixed position; and
   second means responsive to said actuator means for moving said at least one row of contacts towards said plane passing through said slots, after said board is moved to said fixed position, whereby said contacts engage and wipe electrical contact areas on said board.

9. A zero insertion force type edge connector according to claim 8 wherein said first means includes:
   a moveable bottom portion of said slot in said first housing; and
   resilient means attached to said bottom portion for engaging said one edge of said printed circuit board.

10. A zero insertion force type edge connector according to claim 9 wherein said resilient means includes a plurality of metallic springs.

11. A zero insertion force type connector according to claim 9 wherein said resilient means includes a plurality of elastomer pads.

12. A zero insertion force type edge connector according to claim 8 wherein said second means includes:
   inclined surfaces attached to said first housing, slideably engaging said at least one row of electrical contacts; and
   means for moving said inclined surfaces substantially perpendicular to the longitudinal dimension of said slot, thereby moving said electrical contacts toward said plane.

13. A zero insertion force type connector according to claim 8 wherein said actuator means includes:
   a rotatable handle attached to said first base portion;
   cam follower means attached to said first base portion; and
   a linear cam, coupled to said handle, having camming means slideably engaged with said cam follower means and being longitudinally moveable within said first base portion in response to the rotation of said handle.

14. A zero insertion force type edge connector for electrically engaging at least one edge of an electronic component comprising:
   a first and a second base portion supporting a first and a second housing respectively, at least one housing having at least one row of electrical contacts therein;
   an elongated slot in each of said housings for receiving an edge of said electronic component;
   actuator means;
   first means responsive to said actuator means for moving said electronic component to a fixed position, said first means including resilient means located at the bottom portion of said elongated slot in said at least one housing having at least one row of contacts; and second means responsive to said actuator means for moving said at least one row of electrical contacts toward said electronic component after said electronic component is moved to said fixed position, whereby said contacts engage and wipe electrical contact areas on said electronic component.

15. A zero insertion force type edge connector as recited in claim 14 wherein at least one said housing is moveable in a direction substantially perpendicular with the longitudinal dimension of said elongated slot in said housing.

16. A zero insertion force type edge connector as recited in claim 15 wherein said electronic component includes a printed circuit board.

17. A zero insertion force type edge connector as recited in claim 15 wherein said electronic component includes a ceramic substrate.

18. A zero insertion force type edge connector as recited in claim 15 wherein said electronic component includes a porcelainized steel substrate.

19. A zero insertion force type connector for electrically engaging two substantially parallel edges of a printed circuit board comprising:
a first and a second base portion supporting a first and a second housing respectively, each housing having two rows of contacts therein;
an elongated slot in each of said housings between said two rows of contacts for receiving said board along a path that is substantially parallel to said slot;
said first and second housings being arranged so that a plane passas through both of said slots whereby said printed circuit board, lying in said plane, enters said slot in each of said housings;
actuator means;
first means responsive to said actuator means for moving said printed circuit board to a fixed position wherein said first means moves said printed circuit board away from said first base portion and toward said second base portion; and
second means responsive to said actuator means for moving said rows of contacts toward said plane after said board is moved to said fixed position, whereby said contacts engage and wipe electrical contact areas on said board.

20. A zero insertion force type connector according to claim 19 wherein said first means includes:
moveable bottom portions of said slots in said housings; and
resilient means attached to said bottom portions for engaging said substantially parallel edges of said printed circuit board.

21. A zero force type connector according to claim 20 wherein said resilient means includes a plurality of metallic springs.

22. A zero insertion force type connector according to claim 20 wherein said resilient means includes a plurality of elastomer pads.

23. A zero insertion force connector according to claim 19 wherein said second means includes:
inclined surfaces, attached to said housings, slideably engaging said electrical contacts; and
means for moving said inclined surface substantially perpendicular to the longitudinal dimension of said slot thereby moving said electrical contacts toward said plane.

24. A zero insertion force type connector according to claim 19 wherein said actuator means includes:
a rotatable handle;
cam follower means attached to at least one of said first and second base portions; and
a linear cam, coupled to said handle, having camming means slideably engaged with said cam follower means and being longitudinally moveable within said at least one of said first and second base portions in response to the rotation of said handle.

* * * * *

UNITED STATES PATENT AND TRADEMARK OFFICE
CERTIFICATE OF CORRECTION

PATENT NO. : 4,544,223

DATED : October 1, 1985

INVENTOR(S) : John B. Gillett

It is certified that error appears in the above-identified patent and that said Letters Patent is hereby corrected as shown below:

Claim 21.

Col. 10, line 15    After "zero" insert --insertion--.

Signed and Sealed this

Eighteenth Day of February 1986

[SEAL]

Attest:

DONALD J. QUIGG

Attesting Officer

Commissioner of Patents and Trademarks